(12) United States Patent
Ku et al.

(10) Patent No.: US 7,492,653 B2
(45) Date of Patent: Feb. 17, 2009

(54) SEMICONDUCTOR MEMORY DEVICE CAPABLE OF EFFECTIVELY TESTING FAILURE OF DATA

(75) Inventors: Young-Jun Ku, Kyoungki-do (KR); Beom-Ju Shin, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 98 days.

(21) Appl. No.: 11/647,633

(22) Filed: Dec. 28, 2006

(65) Prior Publication Data
US 2008/0002491 A1 Jan. 3, 2008

(30) Foreign Application Priority Data
Jun. 29, 2006 (KR) .................. 10-2006-0059259

(51) Int. Cl.
*G11C 7/00* (2006.01)
*G11C 8/00* (2006.01)

(52) U.S. Cl. ............. 365/201; 365/189.05; 365/189.08; 365/194; 365/230.03

(58) Field of Classification Search .................. 365/201, 365/194, 189.05, 189.08, 230.08, 63, 205, 365/207, 208, 230.03
See application file for complete search history.

(56) References Cited

U.S. PATENT DOCUMENTS

| | | | | |
|---|---|---|---|---|
| 5,928,373 A | | 7/1999 | Yoo | |
| 6,061,290 A | | 5/2000 | Shirley | |
| 6,166,967 A | * | 12/2000 | Do | 365/201 |
| 6,301,169 B1 | * | 10/2001 | Kikuda et al. | 365/201 |
| 6,574,159 B2 | * | 6/2003 | Ohbayashi et al. | 365/201 |
| 6,650,582 B2 | * | 11/2003 | Matsumoto et al. | 365/201 |
| 6,724,684 B2 | * | 4/2004 | Kim | 365/189.05 |
| 6,741,511 B2 | * | 5/2004 | Nakao | 365/201 |
| 6,924,685 B2 | | 8/2005 | Bae | |
| 6,965,532 B2 | * | 11/2005 | Shim | 365/194 |
| 7,046,563 B1 | * | 5/2006 | Kim | 365/201 |
| 7,187,195 B2 | * | 3/2007 | Kim | 365/201 |
| 7,196,949 B2 | * | 3/2007 | Park | 365/194 |
| 7,212,449 B2 | * | 5/2007 | Lee | 365/189.05 |
| 7,266,030 B2 | * | 9/2007 | Do et al. | 365/201 |
| 7,321,517 B2 | * | 1/2008 | Ikeda et al. | 365/194 |
| 7,355,899 B2 | * | 4/2008 | Shin | 365/189.05 |
| 2004/0210809 A1 | | 10/2004 | Cho | |

FOREIGN PATENT DOCUMENTS

KR 2001-0065829 7/2001

* cited by examiner

*Primary Examiner*—Trong Phan
(74) *Attorney, Agent, or Firm*—Blakely, Sokoloff, Taylor & Zafman

(57) ABSTRACT

The present invention relates to an apparatus and a method for detecting a failure of data in the semiconductor memory device. The semiconductor memory device according to the present invention includes: a global I/O line for transferring data between an external circuit and a local I/O line; an I/O sense amplifier for controlling a data transmission between the local I/O line and the global I/O line; and an I/O sense amplifier control unit for controlling the I/O sense amplifier in response to a test mode signal in order to test the semiconductor memory device, independent of the data outputted from a memory cell.

5 Claims, 4 Drawing Sheets

US 7,492,653 B2

SEMICONDUCTOR MEMORY DEVICE CAPABLE OF EFFECTIVELY TESTING FAILURE OF DATA

CROSS-REFERENCE TO RELATED APPLICATION

The present invention claims priority of Korean patent application number 10-2006-0059259, filed on Jun. 29, 2006, which is incorporated by reference in its entirety.

BACKGROUND OF THE INVENTION

The present invention relates to a semiconductor design technology; and, more particularly, to an apparatus and a method for detecting a failure of data in the semiconductor memory device.

Generally, the major operation of the DRAM which has been widely used in the semiconductor memory device is to read data from a memory cell and write data to a memory cell. Therefore, it is very important to effectively test the read/write operation. That is, when data are written or read out in response to the same address signal and there is a difference between the read-out data and the written data because of a data failure, it is important to find out where the failure is in the memory cells.

When the test is carried out in the read or write operation of the memory cells, the various commands, such as active command, write command, precharge command, active command, read command and precharge command, are applied to the memory cells. Then, after the data are written to the memory cell and the memory cell is then precharged, a bit line charge sharing is caused by the read-out data from the memory cell.

However, it is difficult to find out whether there is the failure in the memory cell or in the peripheral circuit through the above-mentioned test. Accordingly, when the failure occurs in the memory device, the defect is detected by writing the data to a bit line sense amplifier of a bank and by reading out the data from the bit line sense amplifier through a conventional test of "WRITE VERIFIED READ." That is, the commands are applied as follows: 1) activation, 2) write, 3) read, and 4) precharge. When data on the bit line sense amplifier are read out without the precharge operation after the write operation, there is a failure if the read-out data are the same as the write data.

Also, there is still a problem in that only the failure of the memory cell can be detected. It is very difficult to test a failure of data in the case where there is a defect in the bit line sensing amplifier or a local I/O line. That is, since there is no method for further subdividing the test area and testing it, it is difficult to concretely detect whether the failure is generated or not.

SUMMARY OF THE INVENTION

Embodiments of the present invention are directed to provide a semiconductor memory device capable of elaborately testing a failure of data.

In accordance with an aspect of the present invention, there is provided a semiconductor memory device comprising: a global I/O line for transferring data between an external circuit and a local I/O line; an I/O sense amplifier for controlling a data transmission between the local I/O line and the global I/O line; and an I/O sense amplifier control unit for controlling the I/O sense amplifier in response to a test mode signal in order to test the semiconductor memory device, independent of the data outputted from a memory cell.

In accordance with another aspect of the present invention, there is provided a method for testing a semiconductor memory device comprising the steps of: transferring data, which are applied from an external circuit in a write operation, to a local I/O line through a global I/O line; and preventing the data to be read out from a memory cell to the local I/O line from being transferred to the global I/O line in a read operation and outputting the data to be temporarily stored in the global I/O line to the external circuit.

DESCRIPTION OF SPECIFIC EMBODIMENTS

An object of the present invention is to provide a semiconductor memory device capable of elaborately testing a failure by further subdividing a test area into smaller sections for testing.

Another object of the present invention is to provide a semiconductor memory device capable of testing a data failure between data input pads in the global I/O line by controlling an I/O sense amplifier.

The present invention subdivides the test area of the semiconductor memory device into three sections and then executes the failure test of the data by independently operating these three sections. Therefore, the consideration of countermeasure according to a failure of data can be set on effectively and the data failure of the semiconductor memory device can be detected effectively. Moreover, the data failure of the semiconductor memory device, in which the bank action is not verified, can be detected effectively.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Figure 1:
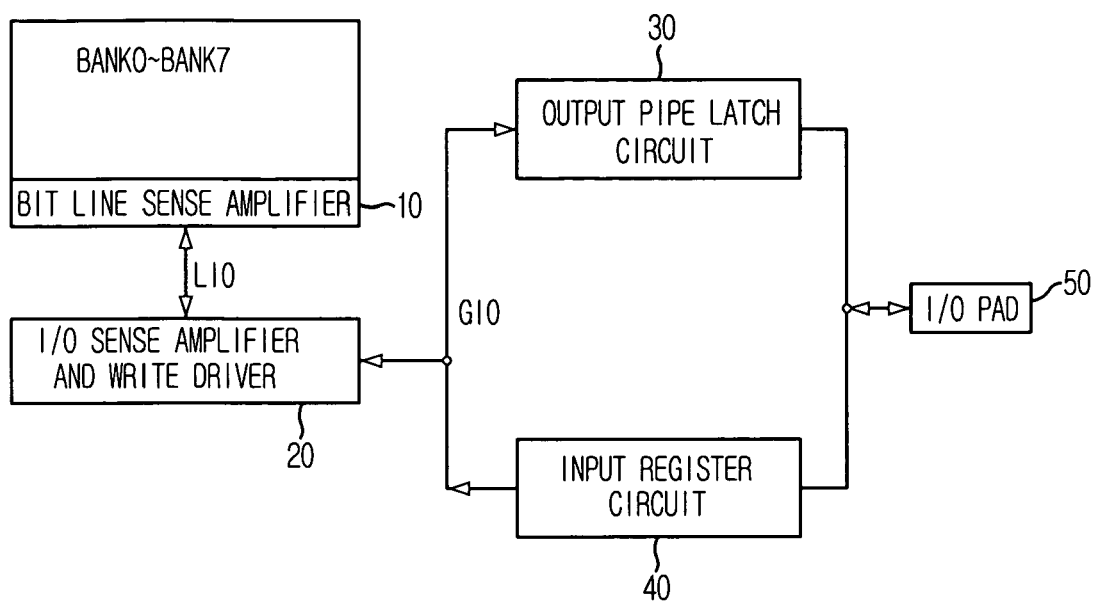
FIG. 1 is a block diagram illustrating a conventional DRAM.

FIG. 1 is a block diagram illustrating a conventional DRAM. Referring to FIG. 1, the DRAM includes banks BANK0 to BANK7 having a plurality of memory cells, a bit line sense amplifier 10 to amplify data, an I/O sense amplifier and write driver 20 driven at a read operation in order to transfer the data from a local I/O line LIO to a global I/O line GIO and driven at a write operation in order to transfer the data from the global I/O line GIO to the local I/O line LIO, an output pipe latch circuit 30 to temporally store the data transferred from the I/O sense amplifier and write driver 20, an input register circuit 40 to temporarily store data transferred from an external circuit, and an I/O pad 50 connected to the external circuit to input or output the data. Here, the I/O sense amplifier and write driver 20 is controlled to achieve the present invention.

Figure 2:
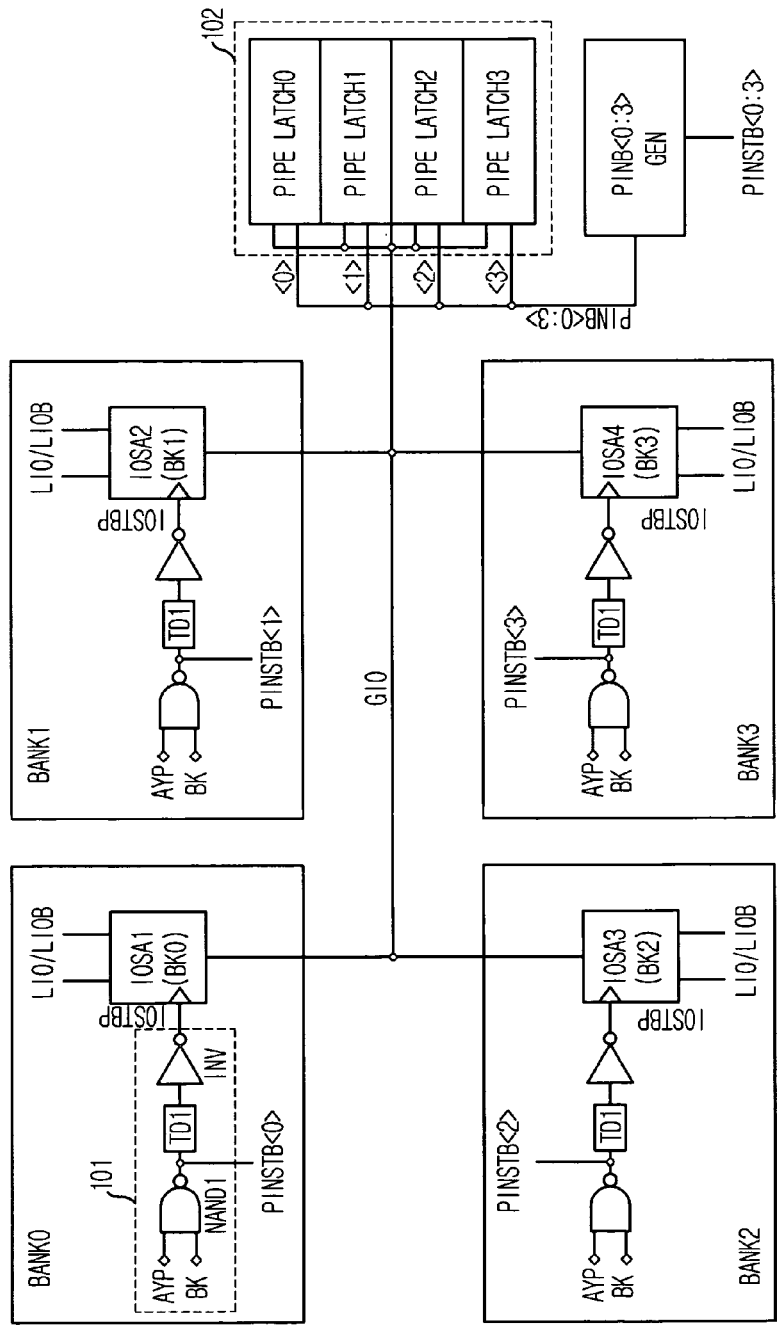
FIG. 2 is a circuit diagram illustrating a conventional I/O sense amplifier.

FIG. 2 is a circuit diagram illustrating a conventional I/O sense amplifier. Referring to FIG. 2, the I/O sense amplifier IOSA1, which is typically provided based on each of banks BANK0 to BANK3 (four bank structure), plays the role of transferring the data loaded to the local I/O lines LIO/LIOB to the global I/O line GIO. The I/O sense amplifier IOSA1 within only one bank will be illustrated.

The I/O sense amplifier IOSA1 includes a control circuit and the I/O sense amplifier control circuit 101 includes a first NAND gate NAND1 receiving an internal read signal AYP generated in response to a read command and a bank select signal BK, a first delay circuit TD to delay an output signal of the first NAND gate NAND1, and a first inverter INV1 to invert an output signal of the first delay circuit tD1 and then output the inverted signal as an I/O sense amplifier enable signal IOSTBP.

At this time, the output signal PINSTB <0:3> of the first NAND gate NAND1 is used as a source signal for a control signal PINB <0:3> of an output pipe latch circuit 102, which is equipped in one end of the global I/O line GIO, for temporally storing the data.

Figure 3:
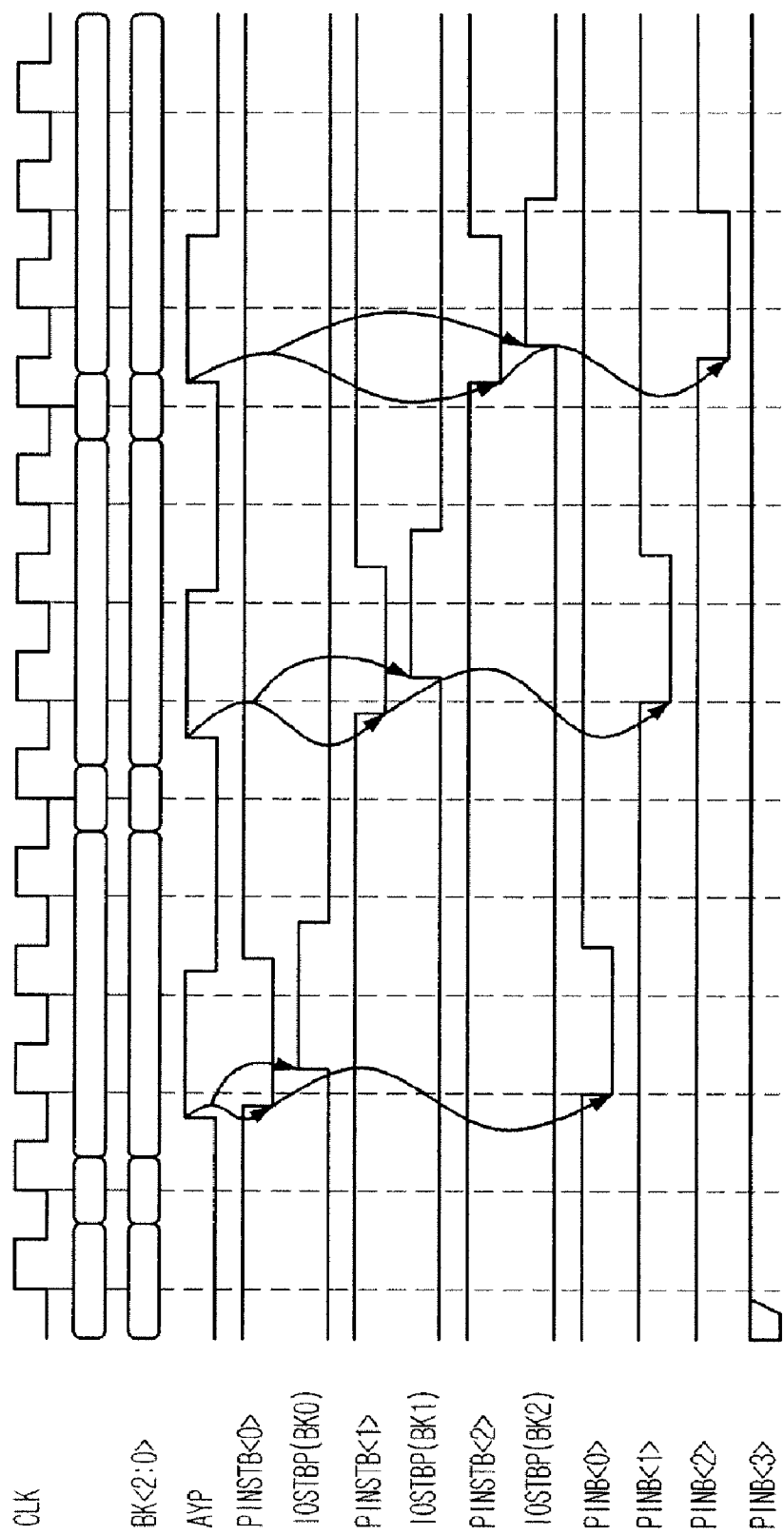
FIG. 3 is a timing diagram of the I/O sense amplifier in FIG. 2.

The operation of the I/O sense amplifier IOSA1 will be illustrated referring to FIG. 3. As shown in FIG. 3, the output pipe latch control source signal PINSTB<0> and the I/O sense amplifier enable signal IOSTBP BK0 are activated in response to a first rising edge of the internal read signal AYP at the read operation. Accordingly, the data outputted by the bank select signal BK<2:0> are delivered to the global I/O line GIO and the output data are latched in the output pipe latch circuit 102. The data is outputted to an external circuit according to the output pipe latch control signal PINB<0> generated by the output pipe latch control source signal PINSTB<0>.

The main characteristic of the present invention is achieved through this I/O sense amplifier IOSA1 and the control circuit 101. That is, the tested area is subdivided into some sections and the failure of the data is detected in the subdivided section.

Figure 4:
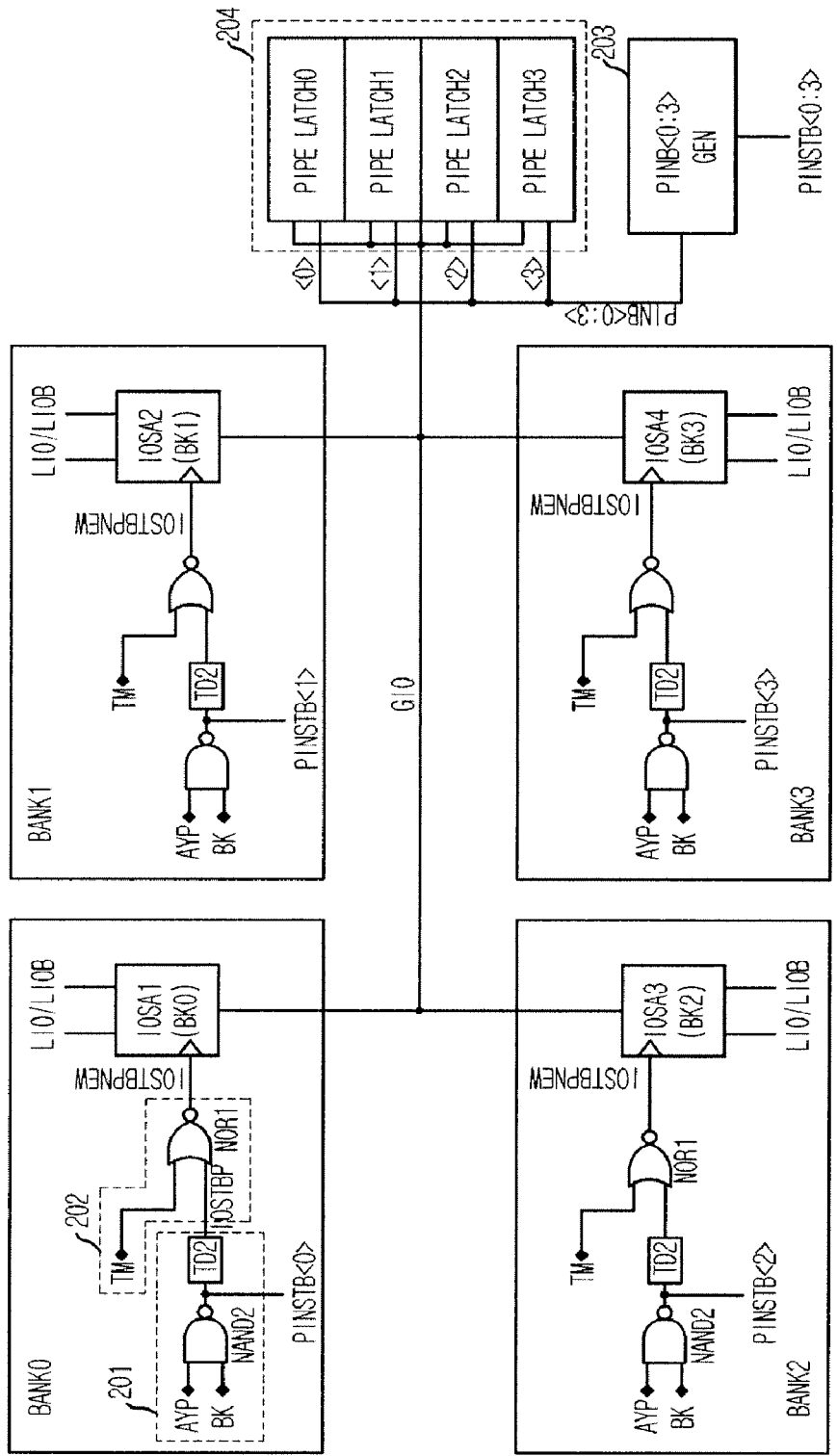
FIG. 4 is a circuit diagram illustrating a method for testing a data failure according to one embodiment of the present invention.

FIG. 4 is a circuit diagram illustrating a method for testing a data failure according to one embodiment of the present invention. Referring to FIG. 4, the failure test of the data employs the I/O sense amplifiers IOSA1 to IOSA4, which are respectively positioned between the local I/O line LIO/LIOB and the global I/O line GIO to control the electrical transmission of the data.

In the conventional memory device, the failure test of the data is carried out individually in the memory cell area and the peripheral circuit area (from the bit line sense amplifier to the data I/O pad). In the present invention, with the classification of the memory cell area and the peripheral circuit area, each of the local I/O line LIO/LIOB and the global I/O line GIO is considered as an individual test section.

That is, as being different from the conventional failure test having two test sections, the present invention has three sections for the failure test of the data. To achieve this failure test, in the present invention, the data transmission from the local I/O line LIO/LIOB to the global I/O line GIO should be controlled at a test mode which detects the data failure using the I/O sense amplifiers IOSA1 to IOSA4.

Therefore, it is important to stop the operation of the sense amplifiers IOSA1 to IOSA4 in response to a control signal from an I/O sense amplifier controller to control the sense amplifiers IOSA1 to IOSA4. In FIG. 4, the banks are respectively correspondent to four sense amplifiers IOSA1 to IOSA4 one by one. Since each of the sense amplifiers IOSA1 to IOSA4 has the same configuration in the circuit implement, only one sense amplifier IOSA1 will be described in the present invention.

The I/O sense amplifier control circuit includes an I/O sense amplifier driving signal generating unit 201 to produce an I/O sense amplifier driving signal IOSTBP in response to the internal read signal AYP and the bank select signal BK, and an I/O sense amplifier driving signal control unit 202 to control the activation of I/O sense amplifier driving signal IOSTBP in response to a test mode signal TM. At this time, the I/O sense amplifier driving signal generating unit 201 further includes a pipe latch driving signal generator 203 for controlling an output pipe latch circuit 204 in which the data passing through the global I/O line GIO are temporarily stored.

More concretely, the I/O sense amplifier driving signal generating unit 201 can be implemented by a second NAND gate NAND2, which receives the internal read signal AYP and the bank select signal BK and outputs the output pipe latch driving signal PINSTB, and a second delay circuit TD2 to delay an output signal of the second NAND gate NAND2 and to output the I/O sense amplifier driving signal IOSTBP. The I/O sense amplifier driving signal control unit 202 can be implemented by a first NOR gate NOR1 which receives the I/O sense amplifier driving signal IOSTBP and the test mode signal TM as input signals and which outputs new I/O sense amplifier driving signal IOSTBPNEW.

The whole operation of the failure test in FIG. 4 will be described in detail below.

When the semiconductor device enters into the test mode for detecting the data failure, data are applied to the global I/O line GIO through data I/O pads in a write operation. The data loaded to the global I/O line GIO are delivered through the I/O sense amplifiers IOSA1 to IOSA4 connected to the selected local I/O line LIO/LIOB to the memory cell and the data are written in the memory cell. At this time, the data read out from the global I/O line GIO are temporarily stored in the latch circuit which is provided in the global I/O line GIO itself. Subsequently, when the read operation is carried out, the data in the memory cell are transferred to the local I/O line LIO/LIOB. At this time, the I/O sense amplifier IOSA1, which manages the data transmission between the global I/O line GIO and the local I/O line LIO/LIB, does not operate in the test mode. That is, the written data are not transferred to the global I/O line GIO directly. Therefore, the data transferred to an external circuit come from the global I/O line GIO to temporarily store the data.

In view of the external circuit, the data are transferred to the global I/O line GIO in the write operation and the data are outputted from the global I/O line GIO in the read operation by utilizing the written data as the read-out data. The above-motioned testing method is employed to find out whether there is any data failure in the peripheral circuit area. The failure in the memory cell is detected by writing the data to the bit line sense amplifier and reading out the written data from the memory cell to the external circuit. Generally, the latch circuit of the global I/O line GIO does not include a reset circuit, because the driving force of the latch circuit is weak. Therefore, if '1' is inputted while, for example, '0' is latched, the latch circuit can be reset by the drivability of the logic data '1' even though a reset circuit is not provided thereto. This is the same as the present invention so that the latched data in the global I/O line GIO are transferred to the external circuit at the read operation.

In order words, the test method to find out the data failure, according to the present invention, divides the semiconductor memory device into three sections, the memory cell (hereinafter, referred to as 'the first area'), an output line from the bit line sense amplifier to the local I/O line (hereinafter, referred to as the second area) and the I/O pad from the global I/O line GIO to the data I/O pad (hereinafter, referred to as the third area). First, the first and second areas independently operate by temporarily storing the data to be written in the bit line sense amplifier and outputting the stored data in the read operation. Second, the second and third areas also independently operated by controlling the I/O sense amplifiers IOSA1 to IOSA4 to connect these two areas and by temporarily storing the data written in the global I/O line GIO and outputting the temporarily stored data in the read operation.

While the present invention has been described with respect to the specific embodiments, it will be apparent to those skilled in the art that various changes and modifications may be made without departing from the spirit and scope of the invention as defined in the following claims. For example, in the above-mentioned embodiment of the present invention, the kinds and arrangements of the logic circuits are illustrated based on high active output signals in each logic circuit. Therefore, when the active signal is changed in a logic level, the detailed implement of the logic circuit is to be changed. Since the number of cases is very massive in the modification of the logic circuits and this modification is easy to a person having an ordinary skill in the art, each modification and change is not illustrated directly in the present invention.

What is claimed is:

1. A semiconductor memory device comprising:
   a global I/O line for transferring data between an external circuit and a local I/O line;
   an I/O sense amplifier for controlling a data transmission between the local I/O line and the global I/O line; and
   an I/O sense amplifier control unit for controlling the I/O sense amplifier in response to a test mode signal in order to test the semiconductor memory device, independent of the data outputted from a memory cell, wherein the I/O sense amplifier control unit includes:
   an I/O sense amplifier driving signal generating unit for producing an I/O sense amplifier driving signal in response to an internal read signal and a bank select signal; and
   an I/O sense amplifier driving signal control unit for controlling the I/O sense amplifier driving signal in response to the test mode signal.

2. The semiconductor memory device in accordance with claim 1, further comprising a pipe latch driving signal generating unit to control a pipe latch unit which temporarily stores the data transferred by the global I/O line.

3. The semiconductor memory device in accordance with claim 1, wherein the I/O sense amplifier driving signal control unit is a first NOR gate to receive the test mode signal and the I/O sense amplifier driving signal.

4. The semiconductor memory device in accordance with claim 2, wherein the I/O sense amplifier driving signal generating unit includes:
   a first NAND gate to receive the internal read signal and the bank select signal and to output a combined signal as a pipe latch driving signal; and
   a first delay circuit for delaying the combined signal from the first NAND gate in order to output the I/O sense amplifier driving signal.

5. A method for testing a semiconductor memory device comprising the steps of:
   transferring data, which are applied from an external circuit in a write operation, to a local I/O line through a global I/O line; and
   preventing the data to be read out from a memory cell to the local I/O line from being transferred to the global I/O line in a read operation and outputting the data to be temporarily stored in the global I/O line to the external circuit, wherein the step of preventing the data from being transferred to the global I/O line is performed in an I/O sense amplifier to control a data transmission between the global I/O line and the local I/O line, and
   wherein the I/O sense amplifier prevents the data from being transferred to the global I/O line in response to a control signal which is produced by an output signal of a NOR gate to receive a test mode signal and an I/O sense amplifier driving signal.

* * * * *